United States Patent [19]

Shimizu et al.

[11] Patent Number: 4,767,642

[45] Date of Patent: Aug. 30, 1988

[54] METHOD FOR PREVENTION OF RESIN PLATE SURFACE STICKING

[75] Inventors: Takaaki Shimizu, Ebina; Katsuyuki Ota, Atsugi; Toshimi Aoyama, Fujisawa; Setsuo Nojima, Atsugi, all of Japan

[73] Assignee: Photopoly Ohka Co., Ltd., Kanagawa, Japan

[21] Appl. No.: 14,372

[22] Filed: Feb. 10, 1987

[30] Foreign Application Priority Data

Feb. 10, 1986 [JP] Japan .................. 61-025737

[51] Int. Cl.$^4$ .................. B05D 3/06; G03F 7/00
[52] U.S. Cl. .................. 427/54.1; 430/300; 430/309; 430/428
[58] Field of Search .............. 430/300, 309, 328, 428; 427/54.1, 43.1

[56] References Cited

U.S. PATENT DOCUMENTS

| | | | |
|---|---|---|---|
| 4,087,569 | 5/1978 | Hatzakis | 427/43.1 |
| 4,163,082 | 7/1979 | Romenesko | 427/54.1 X |
| 4,263,386 | 4/1981 | Datta et al. | 430/25 |
| 4,345,020 | 8/1982 | Yoneda et al. | 427/43.1 X |
| 4,360,968 | 11/1982 | D'Amico et al. | 427/54.1 X |
| 4,460,675 | 7/1984 | Gruetzmacher et al. | 430/300 |
| 4,595,635 | 6/1986 | Dubrow et al. | 427/54.1 X |

FOREIGN PATENT DOCUMENTS

| | | |
|---|---|---|
| 0017927 | 10/1980 | European Pat. Off. . |
| 31487 | 10/1975 | Japan . |
| 38964 | 12/1975 | Japan . |
| 135838 | 10/1980 | Japan . |
| 262742 | 11/1986 | Japan . |

*Primary Examiner*—Thurman K. Page
*Attorney, Agent, or Firm*—Lowe, Price, LeBlanc, Becker & Shur

[57] ABSTRACT

This invention is a method for preventing sticking of a resin plate surface by coating the solution of binder and photopolymerizable monomer on the surface of a photosensitive resin composed of binder, photopolymerizable monomer, and photopolymerization initiator, developing relief images by a photomechanical process, and then by drying the coating solution.

19 Claims, No Drawings

METHOD FOR PREVENTION OF RESIN PLATE SURFACE STICKING

FIELD OF THE INVENTION

This invention relates to a method for preventing sticking of a printing plate surface made from a photosensitive resin. More particularly, this invention relates to a method for preventing the sticking of a printing plate surface by coating a solution of binder and photopolymerizable monomer on the printing plate surface which is made from photosensitive resin and then by drying the spread solution. Therefore, this invention is useful in the field of printing.

DESCRIPTION OF THE PRIOR ARTS

Among various photosensitive resins, the one cured by irradiation of light, especially UV rays, is well-known as the negative-type photosensitive resin. This negative-type photosensitive resin is composed of binder, photopolymerizable monomer, and photopolymerization initiator. Since a sticking binder is generally used for such a composite, the stickiness usually remains on the printing plate surface of a photosensitive resin cured by light. When the plate is used for printing, with some remaining stickiness on the surface, paper dust adheres to the surface so that the transfer of ink to the convex surface of the printing plate not only is a problem, but the quality of printing also becomes worse due to ink clogged in the fine concave structure of the printing plate.

The following three methods have been carried out for preventing the stickiness of a printing plate surface; some step being necessary after irradiation by UV rays for these methods:

(1) a method for treating the exposed surface of a resin plate with an aqueous solution containing hydrochloric acid and sodium hypochlorite, (2) a method for treating the exposed surface of a resin plate with an aqueous solution containing hydrochloric acid, potassium bromide, and potassium bromate, and (3) a method for irradiating the exposed surface of a resin plate with short wavelength UV rays.

In the case of methods (1) and (2), however, there are drawbacks, i.e., they are considerably dangerous because they use a dangerous matter or a violent poison; it takes a long time to treat the printing plate, and the surface is sometimes cracked. Furthermore, since high energy short-wavelength rays are used in method (3), this method is unfavorable for the worker whose eyes may be hit directly by the rays.

SUMMARY OF THE INVENTION

The object of the present invention is to provide a method for settling the bad ink transfer to the convex part of the printing plate due to adhering paper dusts and also for clogging ink in the fine concave structure of a printing plate, by preventing the stickiness of the exposed surface of a resin plate.

According to this present invention, a method for preventing the stickiness of the exposed surface of a resin plate is provided by coating a solution containing binder and photopolymerizaable monomer on the surface of a photosensitive resin composed of binder, photopolymerizable monomer, and photopolymerization initiator, (on which relief images were already developed by a photomechanicl process) and then by drying the coating solution.

The present invention will be explained in detail in the following sections.

Photosensitive resins

The photosensitive resin used for the present invention is composed of binder, photopolymerizable monomer, and photopolymerization initiator.

Binders

Polyvinyl alcohol, acrylic resin, ethylene-vinyl acetate copolymer, polyamide resin, polystyrene resin, phenol resin, polyester resin, epoxy resin, polyvinylbutyral resin, and synthetic rubbers can be used as the binder.

Photopolymerizable monomers

Photopolymerizable monomers become polymer through the action of photopolymerization initiator. In other words, all photopolymerizable monomers usually used as a starting material of photosensitive resin can be used for the present invention. Such monomers include acrylate, methacrylate, acrylamides, methacrylamides, allyl alcohol ester, vinyl ethers and vinyl esters.

Acrylate with alcohols such as propyl alcohol, ethylene glycol, polyethylene glycol, propylene glycol, polypropylene glycol, neopentyl glycol, trimethylol propane, pentaerythritol, butanediol and trimethylol ethane can be used for the present purpose. Methacrylate with these alcohols also can be used.

Acrylamide and methylene-bisacrylamide for acrylamide and methacrylamide and methylene-bismethacrylamide for methacrylamide can be used for the present purpose. In addition to the above monomers, acid amides of acrylic and methacrylic acid with polyamide such as ethylenediamide and hexamethylenediamide can similarly be used.

Diallyl esters of phthalic, adipic, and melonic acid can also be used as the allyl alcohol ester.

Vinyl ethers of propyl alcohol, ethylene glycol, polyethylene glycol, propylene glycol, polypropylene glycol, neopentyl glycol, trimethylol propane, pentaerythritol, butanediol, and trimethylol ethane can be used as vinyl ethers.

Divinyl succinate, divinyl adipate, and divinyl phthalate may be used as divinyl esters.

Photopolymerization initiators

Polymerization of photopolymerizable monomers as described above is initiated by irradiation of active rays in the presence of the photopolymerization initiator (for example, anthraquinones such as anthraquinone, 2-methylanthraquinone, for 2-ethylanthraquinone) and benzoins such as benzoin, benzoin methyl ether, and benzoin ethyl ether; furthermore, benzophenon, acetophenone, phenanthrenequinone, and 4,4'-bis(dimethylamino)benzophenone may also be used for the present purpose.

Composition ratio of photosensitive resins

Above described binders, photopolymerizable monomers, and photopolymerization initiators have been used widely as photosensitive resins. Therefore, these components are used in the conventional range of their combination ratios.

Photomechanical process

The conventional photomechanical process can be used for developing relief images on a photosensitive resin according to the present invention. The conventional photomechanical process schematically consists of the selective exposure step, the developing step of non-exposed parts, and, if necessary, drying and post-exposure treatment.

Stickiness prevention liquids

The solution used to prevent the sticking of the printing plate surface for the present invention (that is, the solution containing binder and photopolymerizable monomer, which hereafter will be called "stickiness prevention liquid"), is elucidated in this section.

Binders described already in the preceding "Binders" section as the components of photosensitive resin can be used as the component of the stickiness prevention liquid. Among these acrylic resin is the most favorable.

Photopolymerizable monomers described already in the preceding "Photopolymerizable monomers" section as a component of photosensitive resin can be used as the component of the stickiness prevention liquid. Bi- and trifunctional monomers such as methylene-bisacrylamide, methylene-bismethacrylamide, trimethylol-propane-triacrylate, trimethylol-propane-trimethacrylate, pentaerythritol-triacrylate, and pentaerythritol-trimethacrylate are among the most favorable.

When a solvent can dissolve the binder as well as the photopolymerizable monomer, such a solvent can be used for the present invention; specifically water, trichloroethane, and ethyl acetate. The present stickiness prevention liquid as described above is coated by brushing or spraying on to the resin plate, on which relief images were developed, and then dried properly to form the prevention layer. Sometimes, the plate may be dipped into the liquid.

The stickiness prevention liquid, if necessary, contains the photopolymerization initiator as described in the "Photopolymerization initiators" section.

Appropriate working procedure

The following two methods are recommended for properly carrying the invention.

(1) The stickiness-prevention liquid is spread by spraying or brushing onto the resin plate, on which relief images were developed, and then dried. If necessary, postexposure is also carried out.

(2) The resin plate is dipped into the stickiness-prevention liquid and then dried. If necessary, postexposure is also carried out.

Thickness of the treated layer on resin plate

The thickness of the layer on the resin plate formed by such methods should be in the range of 0.05–50 $\mu$m. If possible, the range of 0.5–10 $\mu$m is preferable for the layer thickness. When the treated layer is thinner than the lower limit of the above range, the layer does not show the effective prevention of the stickiness expected by the present invention. When the treated layer is thicker than the upper limit of the above range, the surface of the exposed plate becomes too solid, like the printing plate. The ink transfer becomes bad and the concave part of the resin plate also gets clogged by the stickiness-prevention liquid which in turn spoils the quality of printing. So, the too-thick layer is also unacceptable. Therefore, the stickiness prevention liquid must be diluted appropriately by solvent so that the thickness of the layer obtained after treatment by the stickiness prevention liquid is within the above range.

Effectiveness of the invention

As a result of the present invention, the stickiness prevention layer or the treated layer is formed on the surface of the photosensitive resin, on which relief images were developed after selective exposure treatment so that paper dust does not adhere to the surface when using the photosensitive resin as the printing plate.

Thus, surface sticking can be prevented without hazard or use of more complicated processes by application of this invention.

The present invention, given these considerable points of effectiveness, provides a very useful method for the printing plate of photosensitive resin.

Embodiment of the invention

The following are examples to explain the invention intelligibly, but the invention is not in any way restricted to these applications.

EXAMPLE 1

The photosensitive resin for flexo-printing, and composed of synthetic rubber, 100 wt part, trimethylol-propane-triacrylate, 10 wt part, and benzophenone, 2 wt part, is coated on a polyester film as a substrate. This film was irradiated from the substrate side by a chemical lamp FL 40BL (Toshiba Corp., Japan) for three minutes at 50 cm from the photosensitive resin. The necessary negative was brought into close contact to the opposite side which was irradiated by the same lamp for eight minutes through the negative film. Then, the non-exposed part of the irradiated resin plate was dissolved by using the developing solution of trichloroethane and isopropyl alcohol (3:1).

The resin plate, on which relief images were developed as described above, was dipped in the stickiness prevention liquid with the following composition:

| | |
|---|---|
| DIANAL BR95 (Polymethyl methacrylate, manufactured by Mitsubishi Rayon Co., Ltd., Japan) | 100 g |
| Trimethylol-propane-triacrylate | 10 g |
| Benzophenone | 1 g |
| Methyl ethyl ketone | 2.5 kg |
| Trichloroethane | 2.5 kg | for ten seconds at room temperature so that the solution was coated on the resin plate. The treated resin plate was dried for 20 minutes at 60° C. and then irradiated for ten minutes by a chemical lamp at 50 cm. The layer formed on the plate had a thickness of 2 $\mu$m. No stickiness could be felt by touch on the surface of the resin plate. When 5000 sheets of paper were printed using the treated resin plate set in a printing machine, ink transferred well to the convex part of the printing plate and did not clog in the concave area. When the printing plate was observed after printing, no paper dust had adhered to the plate surface.

Comparative example 1

A similar experiment was carried out according to the same procedure as Example 1 except for the treatment of the stickiness prevention liquid. In this case, paper dust was found to have adhered to the surface of the plate from the start of printing. Furthermore, ink did not transfer well to the convex part and instead clogged in the concave area.

EXAMPLE 2

In place of the stickiness prevention liquid described in Example 1, 73 g of Flon 11 (Trichloromonofluoromethane manufactured in E. I. Du Pont de Nemours and Company in the U.S.A.) and 48 g of dimethyl ether were added to 62 g of solution with the following composition:

| DEUKABUTYRAL #300 K | 100 g |
|---|---|

(The aforementioned is polyvinyl butyral manufactured by ASAHI DENKA KOGYO K.K. in Japan. Its approximate composition ratio is: polyvinyl acetate/polyvinyl alcohol/polyvinyl butyral=2–8.4 wt.%/9–13 wt.%/78 wt.% minimum with saponification degree 91.6–98% and average degree of polymerization about 700.)

| Pentaerythyritol triacrylate | 5 g |
|---|---|
| Benzoin isopropylether | 1 g |
| Isopropyl alcohol | 2.5 kg |
| Methyl ethyl ketone | 2.5 kg | to make a stickiness-prevention liquid which was packed into a sealed can for spray coating.

Following the procedure described in the Example 1, the canned stickness-prevention liquid was sprayed onto the surface of the photosensitive resin on which a relief images had been formed and then allowed to stand for 5 minutes. Next, the surface was exposed to postexposure for 10 minutes to make a treated coating with a 1 μm thickness. The surface of the resin plate thus prepared was found to be totally free of sticking and no paper dust was found adhering to the resin plate when it went through the printing machine. Furthermore, when visual observation was made to detect whether the printed surface made by the use of the resin plate produced good ink transfer to relief images and fine lines the printed surface was found to be sharp and clear.

EXAMPLE 3

The following reaction was produced: 0.025 g of methyl hydroquinone dissolved in 10 g of water to make a water solution and 74 g of dimethylolurea dimethyl ether, 202 g of N-methylolacrylamide and 2 g of ammonium chloride were added to the water solution; the mixture was stirred and allowed to react for two hours at the temperature of 80° C. Next, the reaction mixture was poured into 1,000 g of acetone, the deposited precipitates were eliminated by filtration and the filtrate was distilled to remove acetone to yield the final product.

| The reaction product | 100 g |
|---|---|
| Polyvinyl acetate with the saponification degree of 80 mol. % and the degree of polymerization of 500 | 100 g |
| Ethylene Glycol | 10 g |
| Benzoin isopropylether | 4 g |
| Methyl hydroquinone | 0.05 g |
| Water | 200 g |

These compounds were placed in a flask and the mixture was stirred at 90° C.; the dissolved solution was poured and spread onto the surface of a steel plate covered with an antihalation layer and dried for 15 hours at 40° C. to make the plate on which a layer of photosensitive resin with 0.6 mm thickness was formed.

A negative film was laid onto the layer of photosensitive resin on the plate and vacuum-contacted to it; the photosensitive layer was exposed for two minutes to light from the same lamp used in the Example 1 placed at a distance of 5 cm. Afterwards, the unexposed part was developed and removed by city water and the film was dried for five minutes at 100° C.

Next, the stickiness prevention liquid used in the Example 2 was sprayed upon the resin on the plate and, after standing for five minutes, the resin was subjected to postexposure by the aforementioned lamp for five minutes.

A rotary press machine fitted with a thus-obtained resin plate printed 50,000 copies; it was found that the ink transfer to the convexes of the plates was good and that there was no ink clogging in the intaglios of the plates.

Comparative Example 2

The plate developed in the Example 3 was dried for 5 minutes at 100° C. and, immediately afterwards, it was subjected to postexpose for five minutes without previously being sprayed with the stickiness-prevention liquid.

The resin plate was fitted to a rotary press machine which duly started printing. It was observed that fine lines against white back-ground were blurred by the time 10,000 copies were printed. When the resin plate was taken out of the printing machine and the printed surface was observed, it was found that ink and paper dust had adhered to concave.

EXAMPLE 4

As a photosensitive resin composition, polyamide copolymer was prepared in the following way: 60 wt.% of ε-caprolactam, 18 wt.% of hexamethylenediammonium adipate and 22 wt.% of the salt of 5—(sodiumsulfo)isophthalic acid and hexamethylene diamine were placed in an autoclave, air was replaced by nitrogen, temperature was raised for one hour, pressure was kept constant (30 kg/cm$^2$) for 4 hours, released for half an hour and then ordinary pressure was again kept for 5 more hours. Under these pressure conditions, the polyamide copolymer was polymerized at the temperature of 240°–250° C.

| Polyamide copolymer | 100 g |
|---|---|
| Methylene bis acrylamide | 10 g |
| Benzophenone | 2 g |
| Hydroquinone | 0.01 g |
| Methanol | 100 g |
| Water | 20 g |

The solution of the above described composition was poured and spread on the surface of a steel plate covered with an antihalation layer and dried for 15 hours at 40° C. to make the plate on which a layer of photosensitive resin with a 0.6 mm thickness was formed.

A negative film was put onto the layer of photosensitive resin on the plate and vacuum-contacted to it; afterward, the photosensitive layer was exposed, developed and dried in the same manner as the one in Example 3.

On the other hand, the stickiness-prevention liquid of the following composition was prepared:

| | |
|---|---|
| Polyvinyl acetate with saponification degree of 90 mol. % and degree of polymerization of 1,000 | 50 g |
| Polyamide copolymer, same as the one used in the composition of photo-sensitive resin | 50 g |
| Methylene bis acrylamide | 5 g |
| Acrylamide | 5 g |
| Benzophenone | 1 g |
| Methanol | 1,000 g |
| Water | 1,000 g |

The aforementioned stickiness-prevention liquid was applied by brush to the surface of the resin plate that had been subjected to exposure, development and drying, and post-exposure for five minutes after it was dried at 100° C. The resin plate was then fitted to a printing machine which was duly operated; no adhesion of paper dust was observed and well printed material was obtained.

EXAMPLE 5

| | |
|---|---|
| Polyester resin was prepared by the condensation polymerization of 30 mol. % of propylene glycol, 20 mol. % of diethylene glycol, 15 mol. % of adipic acid, 25 mol. % of fumaric acid and 10 mol. % of isophthalic acid | 100 g |
| 2-Hydroxymethacrylate | 10 g |
| Diethylene glycoldimethacrylate | 20 g |
| Diacetone acrylamide | 10 g |
| Benzoin ethylether | 1 g |
| p-methoxyphenol | 0.1 g |

The above compounds were thoroughly mixed to produce a photosensitive resin composition.

Next, a negative film was placed on the glass plate held in a horizontal position and the surface of the film was covered with polypropylene film of a 20 μm thickness; on top of this, a 0.7 mm thick layer of the aforementioned photosensitive resin composition was built by a doctor-knife. Polyethylene terephthalate film with a 100 μm thickness and adhesive layer was laminated on the top layer in such a manner that the adhesive layer would come in contact with the photosensitive resin composition.

Next, the entire construction was subjected to exposure to light from the chemical lamp used in Example 1 and placed at a 10 cm distance for 10 seconds on the side of polyethylene terephthalate film; this construction was also subjected to exposure to light from a 3 kW high pressure mercury lamp placed at 50 cm for 25 seconds on the side of negative film. Once exposure was completed, both negative film and polyproylene film were removed from the construction, the unexposed part was developed and removed by 1 wt.% borax water solution then the surface was dried.

On the other hand, the stickiness-prevention liquid composed of the following compounds was prepared.

| | |
|---|---|
| Elitol UE 3200 (a saturated polyester resin with molecular weight of 15,000 manufactured by UNITIKA Ltd.) | 10 g |
| Trimethylol propane triacrylate | 1 g |
| Benzophenone | 0.1 g |
| Ethyl acetate | 1,000 g |
| Methyl ethyl ketone | 1,000 g |

Aforementioned stickiness-prevention liquid was applied by brush to the resin plate that had been exposed, developed, and dried previously, then the plate was subjected to postexposure for five minutes after standing for 10 minutes at room temperature.

The resin plate was incorporated into a printing machine which was duly operated; no adhesion of paper dust was observed and well printed material was obtained.

What is claimed is:

1. A process for preventing stickiness on a resin plate the surface of which is coated with a photosensitive resin comprised of a binder, a photopolymerizable monomer and a photopolymerization initiator in which a relief image was previously formed by a photomechanical process comprising coating said surface to a thickness of 0.05 μm to 0.50 μm with a solution that contains an organic solvent, a binder and a photopolymerizable monomer, drying said coating, and/or exposing said coating to polymerizing radiation.

2. The process of claim 1 wherein said solution further contains a photopolymerization initiator.

3. The process of claim 1 wherein the binder used contains at least one compound selected from the group of compounds containing polyvinyl alcohol, acryl resin, ethylene-vinylacete copolymer, polyamide, phenolic resin, polyester, epoxy resin, polyvinyl butyral and synthetic rubber.

4. The process of claim 1 wherein the photopolymerizable monomer contains at least one compound selected from the group of compounds containing acrylic ester, methacrylic ester, acrylamides, methacrylamides, allyl alcohol ester, vinyl ethers and vinyl esters.

5. A process of claim 4 wherein the alcohol that constitutes acrylic ester or methacrylic ester contains at least one compound selected from the group of compounds containing propyl alcohol, ethylene glycol, polyethylene glycol, propylene glycol, polypropylene glycol, neopentyl glycol, trimethylol propane, pentaerythritol, butanediol and trimethylol ethane.

6. A process of claim 4 wherein acryl amides or methacrylamides have at least one compound selected from the group of compounds containing acrylamide, methacrylamide, methylene bis acrylamide, methylene bis methacrylamide, ethylene bis acrylamide, ethylene bis methacrylamide, hexamethylene bis acrylamide and hexamethylene bis methacrylamide.

7. A process of claim 4 wherein acidic components of esters of allyl alcohol have at least one compound selected from the group of compounds containing phthalic acid, adipic acid, and malonic acid.

8. A process of claim 4 wherein alcoholic components of vinyl ether have at least one compound selected from the group of compounds containing propyl alcohol, ethylene glycol, polyethylene glycol, propylene glycol, polypropylene glycol, neopentyl glycol, trimethylol propane, pentaerythritol, butanediol and trimethylolethane.

9. A process of claim 4 wherein the acidic components of vinyl ester have at least one compound selected from the group of compounds containing cinnamic acid, phthalic acid and adipic acid.

10. A process of claim 1 wherein the photopolymerization initiator has at least one compound selected from the group of compounds containing substituted or unsubstituted anthraquinone, benzoin, benzoin derivatives, substituted or unsubstituted benzophenone, acetophenone and phenanthrenequinone.

11. A process of claim 10 wherein substituted anthraquinone is 2-methylanthraquinone, or 2-ethylanthraquinone.

12. A process of claim 10 wherein derivatives of benzoin are benzoin methyl ether or benzoin ethyl ether.

13. A process of claim 10 wherein the substituted benzophenone is 4,4'-bis(dimethylamino)benzophenone.

14. A process of claim 1 wherein the binder that was contained in the solution of the photopolymerizable monomer and the binder is at least one polymer of acrylic resin or butyral resin.

15. A process of claim 1 wherein the photopolymerizable monomer that was contained in the solution of the binder and the photopolymerizable monomer and the binder is diacrylate, dimethacrylate, triacrylate or trimethacrylate.

16. A process of claim 1 wherein the solution that contains a binder and a photopolymerizable monomer is applied by spray or brush.

17. A process of claim 1 wherein, by dipping the resin plate with a formed relief image into the solution of a binder and a photopolymerizable monomer, the aforementioned solution is applied to the aforementioned resin plate.

18. A process of claim 1 wherein the solvent for the solution of a binder and a photopolymerizable monomer is at least one compound selected from the group of compounds comprising water, trichloroethane and ethyl acetate.

19. A process of claim 1 wherein the solution of binder and a photopolymerizable monomer is applied to the plate to make a layer with thickness of about 0.5 $\mu$m–about 10 $\mu$m.

* * * * *